(12) United States Patent
Adkisson et al.

(10) Patent No.: US 8,492,272 B2
(45) Date of Patent: Jul. 23, 2013

(54) PASSIVATED THROUGH WAFER VIAS IN LOW-DOPED SEMICONDUCTOR SUBSTRATES

(75) Inventors: James W. Adkisson, Jericho, VT (US);
Jeffrey P. Gambino, Westford, VT (US);
Mark D. Jaffe, Shelburne, VT (US);
Alvin J. Joseph, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 82 days.

(21) Appl. No.: 13/193,991

(22) Filed: Jul. 29, 2011

(65) Prior Publication Data
US 2013/0026646 A1 Jan. 31, 2013

(51) Int. Cl.
*H01L 21/4763* (2006.01)
*H01L 21/04* (2006.01)
*H01L 29/40* (2006.01)

(52) U.S. Cl.
USPC ........... 438/639; 438/510; 438/514; 438/527; 257/774; 257/E23.011; 257/E21.135; 257/E21.158; 257/E21.334

(58) Field of Classification Search
USPC ................... 257/774, 525, 526, 552, E21.577, 257/E21.578, E21.585, E21.586, E23.011, 257/E21.135, E21.158, E21.334; 438/637–640, 438/668, 510, 514, 527
See application file for complete search history.

(56) References Cited

U.S. PATENT DOCUMENTS

| | | | |
|---|---|---|---|
| 5,424,245 A | 6/1995 | Gurtler et al. | |
| 6,117,770 A | 9/2000 | Pramanick et al. | |
| 6,225,204 B1 | 5/2001 | Wu et al. | |
| 7,387,942 B2 | 6/2008 | Wang et al. | |
| 7,678,696 B2 | 3/2010 | Andry et al. | |
| 7,851,923 B2 | 12/2010 | Erturk et al. | |
| 7,902,069 B2 | 3/2011 | Andry et al. | |
| 2010/0035430 A1 | 2/2010 | Andry et al. | |
| 2010/0178761 A1 | 7/2010 | Chen et al. | |
| 2010/0224965 A1* | 9/2010 | Kuo | 257/621 |
| 2011/0021019 A1 | 1/2011 | Konevecki et al. | |
| 2012/0080802 A1* | 4/2012 | Cheng et al. | 257/774 |

OTHER PUBLICATIONS

Koyanagi et al., High-Density Through Silicon Vias for 3-D LSIs—p. 54: right column under graph . . . TSV with poly-Si layer formed as a liner before W deposition . . . ; vol. 97, No. 1, Jan. 2009, Proceedings of the IEEE. pp. 49-59.

* cited by examiner

*Primary Examiner* — Jasmine Clark
(74) *Attorney, Agent, or Firm* — Schmeiser, Olsen & Watts; Anthony J. Canale

(57) ABSTRACT

A method for forming passivated through wafer vias, passivated through wafer via structures, and passivated through wafer via design structures. The method includes: forming a through wafer via in a semiconductor substrate, the through wafer via comprising an electrical conductor extending from a top of the semiconductor substrate to a bottom surface of the semiconductor substrate; and forming a doped layer abutting all sidewalls of the electrical conductor, the doped layer of a same dopant type as the semiconductor substrate, the concentration of dopant in the doped layer greater than the concentration of dopant in the semiconductor substrate, the doped layer intervening between the electrical conductor and the semiconductor substrate.

25 Claims, 10 Drawing Sheets

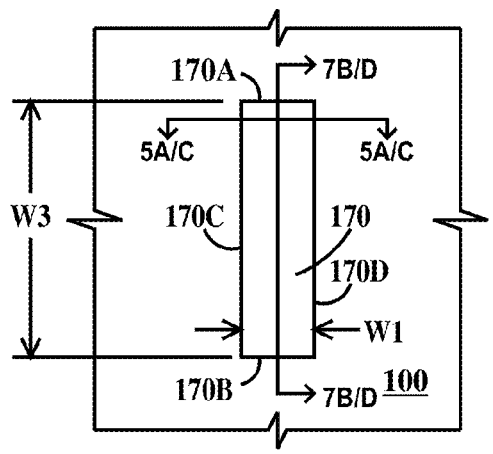
*FIG. 5*
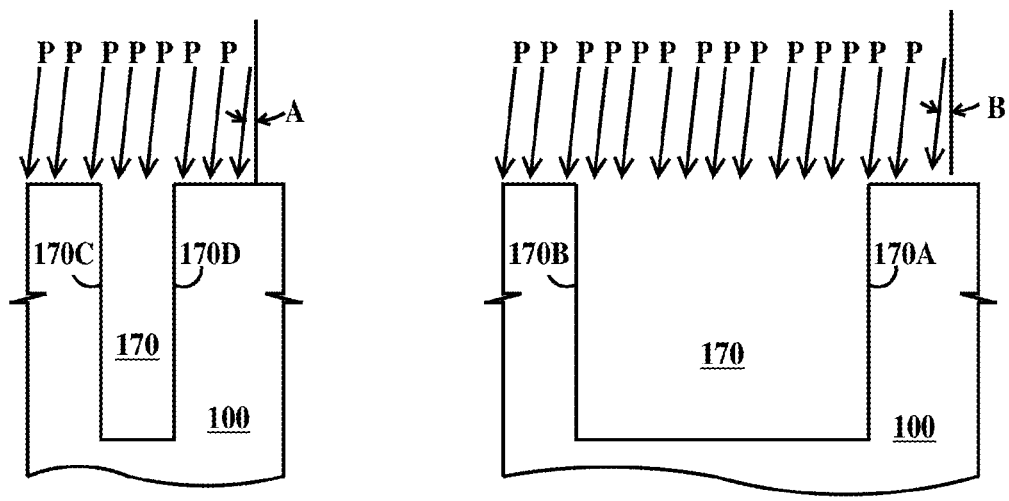
*FIG. 5A*  *FIG. 5B*
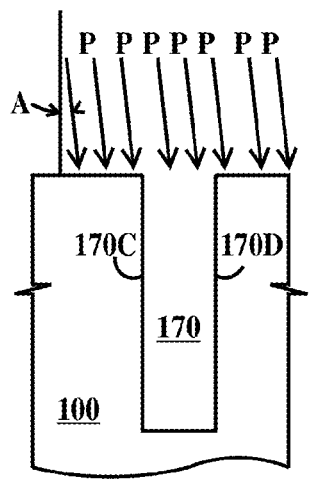
*FIG. 5C*  *FIG. 5D*

US 8,492,272 B2

PASSIVATED THROUGH WAFER VIAS IN LOW-DOPED SEMICONDUCTOR SUBSTRATES

FIELD OF THE INVENTION

The present invention relates to the field of integrated circuit chips; more specifically, it relates to passivated through wafer vias, design structures for passivated through wafer vias, and methods of fabricating passivated through wafer vias.

BACKGROUND

Through wafer vias are used to form electrical contacts from the front side to the backside of semiconductor substrates. Through wafer vias may be insulated or un-insulated from the substrate. Un-insulated vias are used primarily for low-impedance ground contacts in radio frequency (RF) integrated circuits. For certain RF applications semiconductor substrates with very low substrate doping levels are used. The use of conventional un-insulated through wafer vias and very low semiconductor substrate doping levels can lead to undesired current flows between device structures fabricated in the semiconductor substrate and the through wafer vias. Accordingly, there exists a need in the art to eliminate the deficiencies and limitations described hereinabove.

SUMMARY

A first aspect of the present invention is a method, comprising: forming a through wafer via in a semiconductor substrate, the through wafer via comprising an electrical conductor extending from a top of the semiconductor substrate to a bottom surface of the semiconductor substrate; and forming a doped layer abutting all sidewalls of the electrical conductor, the doped layer of a same dopant type as the semiconductor substrate, the concentration of dopant in the doped layer greater than the concentration of dopant in the semiconductor substrate, the doped polysilicon layer intervening between the electrical conductor and the semiconductor substrate.

A second aspect of the present invention is a structure, comprising: a through wafer via in a semiconductor substrate, the through wafer via comprising an electrical conductor extending from a top of the semiconductor substrate to a bottom surface of the semiconductor substrate; and a doped layer abutting all sidewalls of the electrical conductor, the doped layer of a same dopant type as the semiconductor substrate, the concentration of dopant in the doped layer greater than the concentration of dopant in the semiconductor substrate; and, the doped layer intervening between the electrical conductor and the semiconductor substrate.

A third aspect of the present invention is a design structure comprising design data tangibly embodied in a machine-readable medium, the design data being used for designing, manufacturing, or testing an integrated circuit, the design data comprising information describing an isolated through wafer via structure, the isolated through wafer via structure comprising: a through wafer via in a semiconductor substrate, the through wafer via comprising an electrical conductor extending from a top of the semiconductor substrate to a bottom surface of the semiconductor substrate; and a doped layer abutting all sidewalls of the electrical conductor, the doped layer of a same dopant type as the semiconductor substrate, the concentration of dopant in the doped layer greater than the concentration of dopant in the semiconductor substrate; and, the doped layer intervening between the electrical conductor and the semiconductor substrate.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

FIGS. 5, 5A, 5B, 5C and 5D, illustrate the ion-implantation steps of FIG. 4A;

DETAILED DESCRIPTION

The term through wafer via defines a structure that extends from a top surface of a semiconductor substrate, through the semiconductor substrate, to an opposite bottom surface of the semiconductor substrate of an integrated circuit chip. A through wafer via according to embodiments of the present invention is electrically conductive and no insulating layer intervenes between the through wafer via and the semiconductor substrate. The "wafer" of through wafer via derives from the fact that the via is formed before integrated circuits have been singulated from a semiconductor substrate commonly called a wafer, which are often disk-shaped and on which multiple integrated circuit chips are fabricated simultaneously.

Figure 1:
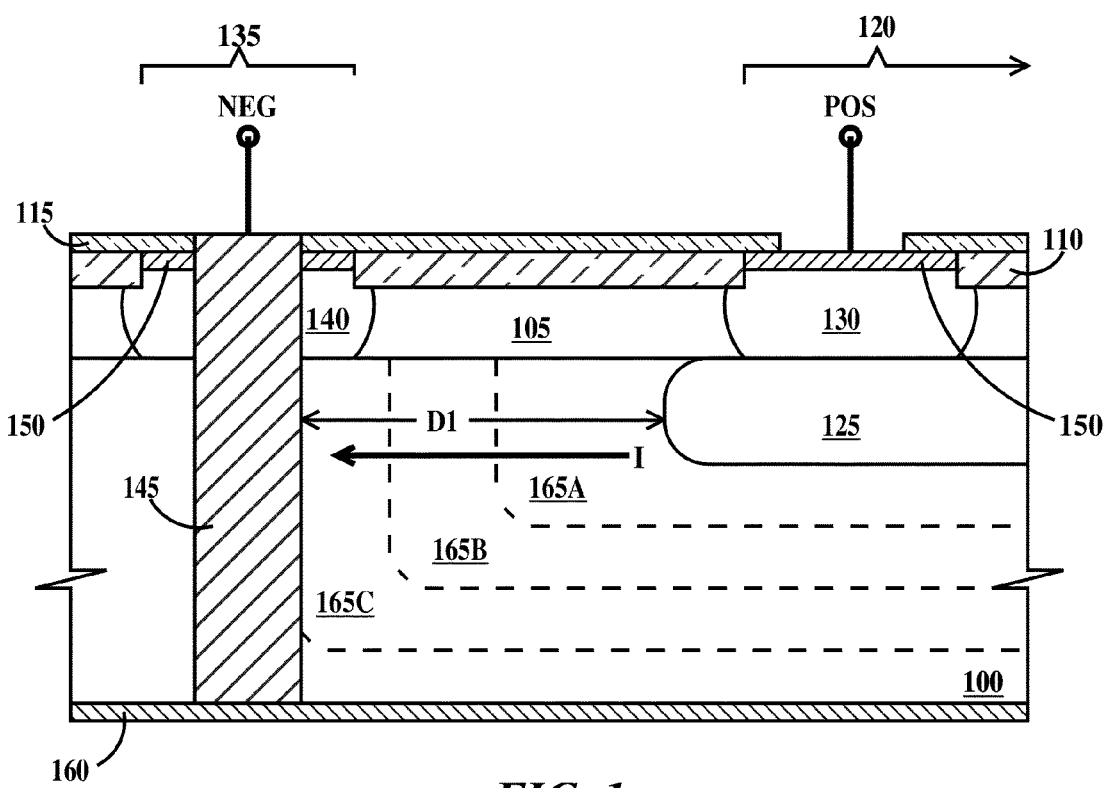
FIG. 1 illustrates the problem solved by embodiments of the present invention.

FIG. 1 illustrates the problem solved by the embodiments of the present invention. In FIG. 1, formed on a P-doped semiconductor substrate 100 is an N-doped epitaxial silicon layer 105. A silicon epitaxial layer 105 is formed on the top surface of semiconductor substrate 100, for example, in a chemical-vapor-deposition (CVD) using silane and phosphine process and has the same crystal lattice structure as the silicon layer which results in an N-type doped epitaxial layer. Formed in epitaxial layer 105 is dielectric trench isolation 110. A barrier layer 115 is formed on trench isolation 110. In one example, barrier layer 115 comprises silicon nitride. In one example, barrier layer 115 is a copper diffusion barrier. Portions of an exemplary bipolar transistor device 120 are formed in semiconductor substrate 100 and epitaxial layer 105. These portions include an N-doped subcollector and an N-doped reach through. Subcollector 125 is formed in semiconductor substrate 100 and reach through 130 is formed in silicon layer 105. Reach through 130 electrically and physically contacts subcollector 125. Though subcollector 125 is illustrated as contained within semiconductor substrate 125, the subcollector may extend into epitaxial silicon layer 105. Other portions of the bipolar device 120, not shown in FIG. 1 would include collector, a base and an emitter.

Also formed in semiconductor substrate 100 and epitaxial layer is a through wafer via 135 comprising a P-doped contact region 140 of epitaxial layer 105 and an electrical conductor 145 in physical and electrical contact with P-doped region 140 and semiconductor substrate 100. Conductor 145 extends from a top surface of epitaxial layer 105 to a bottom surface of semiconductor substrate 100 and is in physical and electrical contact with a conductive layer 160 formed on the bottom surface of semiconductor substrate 100. In one example, conductor 100 comprises tungsten. Formed on top surfaces of reach through 130 and contact region 140 are metal silicide layers 150. In one example, metal silicide layers 150 comprise cobalt silicide.

Subcollector 125 is spaced a distance D1 from conductor 145. The doping level of epitaxial layer 105 is greater than the doping level of semiconductor substrate 100. In one example the doping level of epitaxial layer 105 is between about $1 \times 10^{13}$ atoms/cm3 and about $1 \times 10^{16}$ atoms/cm3. In one example, the doping level of semiconductor substrate. The doping level of contact 140 is much greater (e.g., at least about 10 times greater) than the doping level of semiconductor substrate 100. In one example, the doping level of contact 140 is between about $1 \times 10^{15}$ atoms/cm3 and about $1 \times 10^{17}$ atoms/cm3. In one example, the doping level of semiconductor substrate 100 is between about $1 \times 10^{12}$ atoms/cm3 and about $1 \times 10^{15}$ atoms/cm3. In one example, the resistivity of semiconductor substrate 100 is between about 10 ohm-cm and about 10,000 ohm-cm. A low-doped semiconductor substrate is defined as a semiconductor substrate having a resistivity of about 1,000 ohm-cm or higher. Normal semiconductor substrates have a resistivity between about 10 ohm-cm to about 50 ohm-cm. Alternatively, a low-doped semiconductor substrate is defined as a semiconductor substrate having a doping level of about $1 \times 10^{13}$ atoms/cm3 or lower.

The width of a depletion region around subcollector 125 is a function of the bias voltage applied between subcollector 125 and conductor 145. When a threshold voltage is applied between subcollector 125 and conductor 145, an initial depletion layer 165A forms in semiconductor substrate 100. At a higher intermediate voltage, the depletion layer width has increased as shown by new depletion layer 165B. Finally, at a still higher voltage, the depletion layer can contact conductor 145 as shown by new depletion layer 165C allowing a punch through current I (i.e., a leakage current) to flow between subcollector 125 and conductor 145. Depletion layers 165A, 165B and 165C do not extend into epitaxial layer 105 because it is oppositely doped and do not extend appreciably into contact 140 because it is more highly doped than semiconductor substrate 100. With a semiconductor substrate doping level of about $1 \times 10^{12}$ atoms/cm3, depletion layers around subcollector 125 can approach 140 microns in width with an applied bias of 10 Volts. Thus, D1 must be greater than 140 microns for devices operating at 10 Volts. This wastes a lot of semiconductor substrate area.

Several test structures (bipolar transistors) with different D1 distances were fabricated and the punch through current as a function of voltage measured using a typical collector-emitter breakdown (BVces) measurement. At D1=140 microns, the current was about $1 \times 10^{-11}$ Amperes from 0 Volts to about 20 Volts where the collector-base junction broke down just over 20 Volts. At D1=30 microns, the current was about $1 \times 10^{-11}$ amperes from 0 Volts to about 5 Volts and increased linearly to about $1 \times 10^{-7}$ Amperes at about 20 volts. At D1=20 microns, the current was about $1 \times 10^{-11}$ Amperes at 0 Volts and rose exponentially to about $1 \times 10^{-6}$ Amperes by about 10 Volts. At D1=10 microns, the current was about $1 \times 10^{-8}$ Amperes at 0 Volts and rose exponentially to about $1 \times 10^{-5}$ amperes at about 2.5 Volts.

Figure 2A:
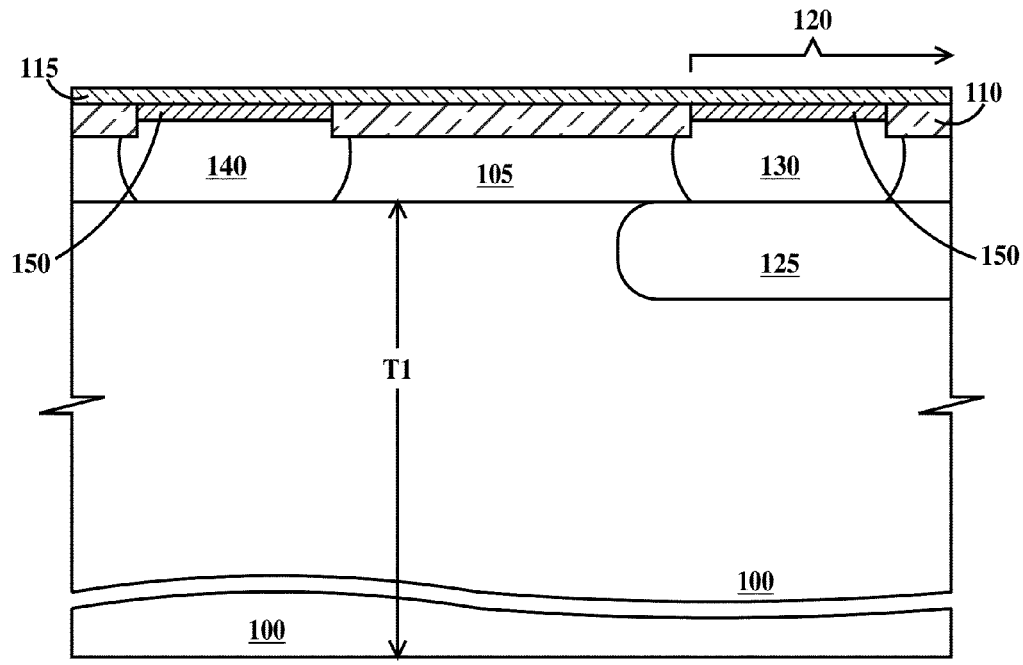
FIGS. 2A through 2B illustrate initial fabrication steps of through wafer vias that are common to the embodiments of the present invention.
Figure 2B:
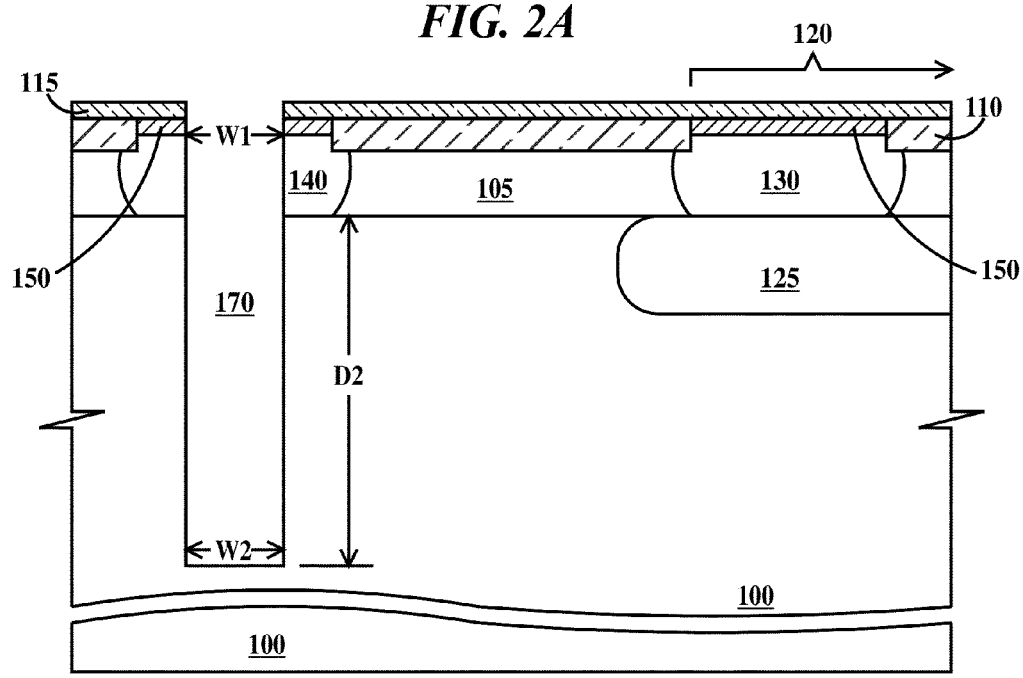

FIGS. 2A through 2B illustrate initial fabrication steps of through wafer vias that are common to embodiments of the present invention. FIG. 2A is similar to FIG. 1 except no through wafer via has been formed and semiconductor substrate 100 has a thickness of T1. In one example, semiconductor substrate 100 is single-crystal silicon. In one example, T1 is between about 700 microns and about 800 microns for a 200 mm diameter semiconductor substrate. In FIG. 2B, a trench 170 has been formed through barrier layer 115, silicide layer 150, contact 140 and into semiconductor substrate 100. Trench 170 extends a depth D2 into semiconductor substrate 100. In one example, D2 is between about 100 microns and about 200 microns. Trench 170 has a minimum width with at the top surface of epitaxial layer 105 of W1. In one example, W1 is 3 microns. Trench 170 has a minimum width W2 at the bottom. In one example, W1=W2. In one example, W1 is greater than W2 and the sidewalls of trench 170 are tapered.

Figure 3A:
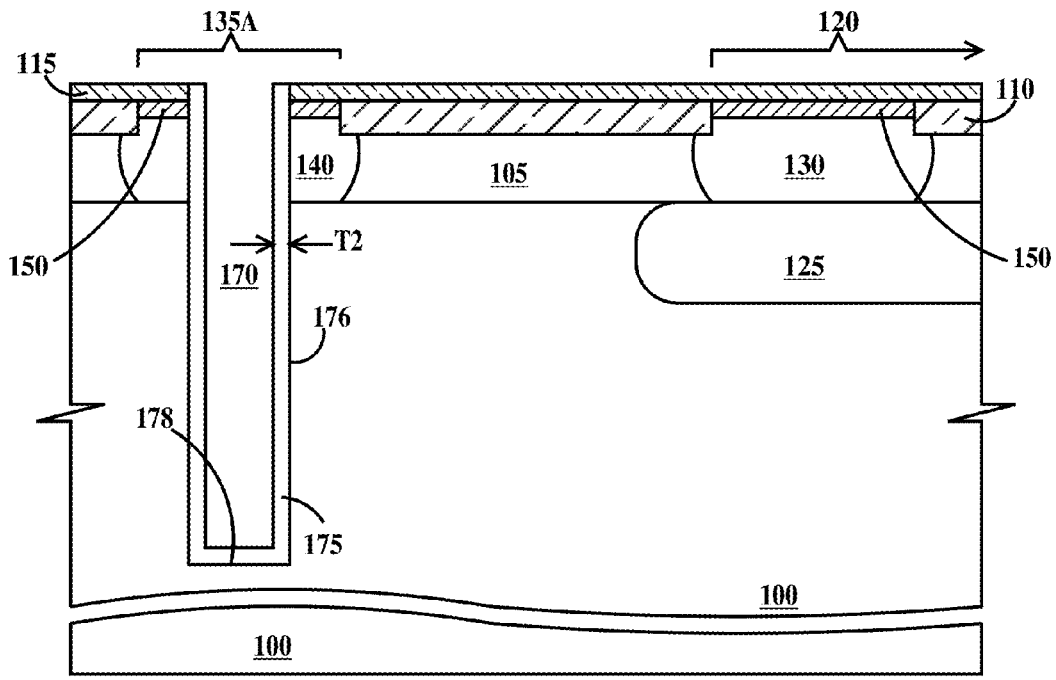
FIGS. 3A through 3D illustrate fabrication of a through wafer via according to an embodiment of the present invention.

FIGS. 3A through 3D illustrate fabrication of a through wafer via according to an embodiment of the present invention. FIG. 3A continues from FIG. 2B. In FIG. 3A, a P-doped polysilicon liner 175 has been formed on the sidewalls 176 of trench 170 and optionally on the bottom 178 of trench 170. In one example, polysilicon layer 175 is formed by in situ boron doped CVD. The P-type doping level of polysilicon layer 175 is greater than the P-type doping level of semiconductor substrate 100. Polysilicon layer 175 has a thickness T2. In one example, T2 is between about 50 Angstroms and about 1000 Angstroms. In one example, the P-type doping level of polysilicon layer 175 is between about $1 \times 10^{18}$ atoms/cm3 and about $1 \times 10^{20}$ atoms/cm3. In one example, the resistivity of polysilicon layer 175 is between about 0.001 ohm-cm and about 0.04 ohm-cm. Because polysilicon layer 175 is formed after metal silicide layers 150 have been formed, the temperature of semiconductor substrate 100 should not exceed about 600° C. during or after formation of the polysilicon layer.

Figure 3B:
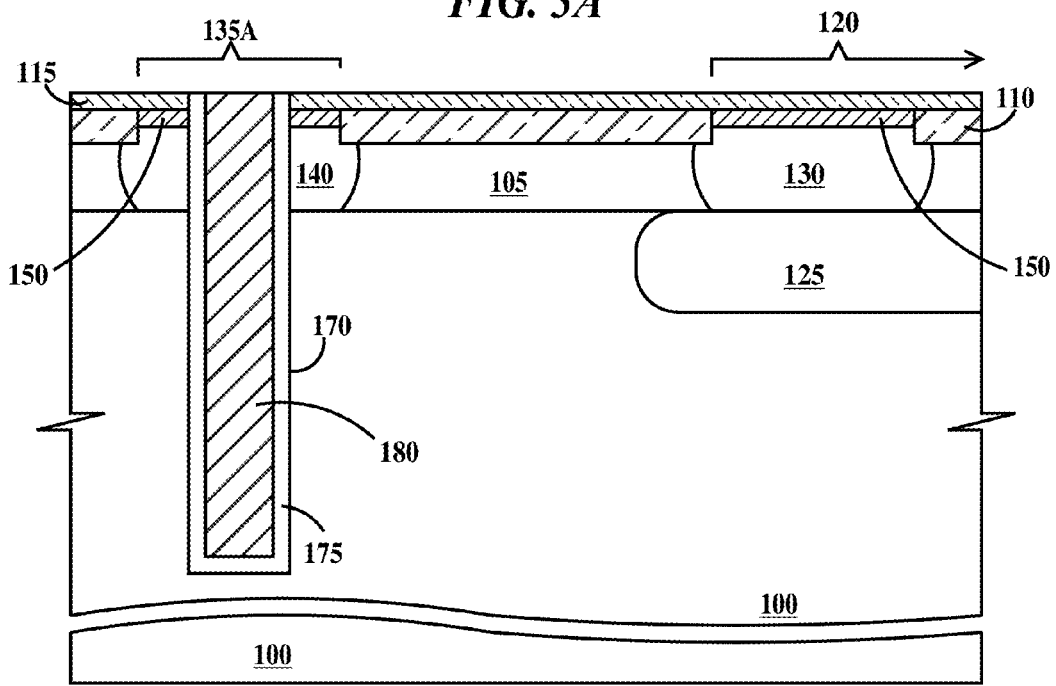

In FIG. 3B, the remaining space in trench 170 is filled with an electrical conductor 180 to form a through wafer via 135A. In one example, electrical conductor 180 is a metal. In one example, electrical conductor 180 is tungsten. In one example, conductor 180 is form by deposition of a conductive layer that fills the remaining space in trench 170 followed by a chemical-mechanical-polish to coplanarize a top surface of conductor 180 and a top surface of barrier layer 115.

Figure 3C:
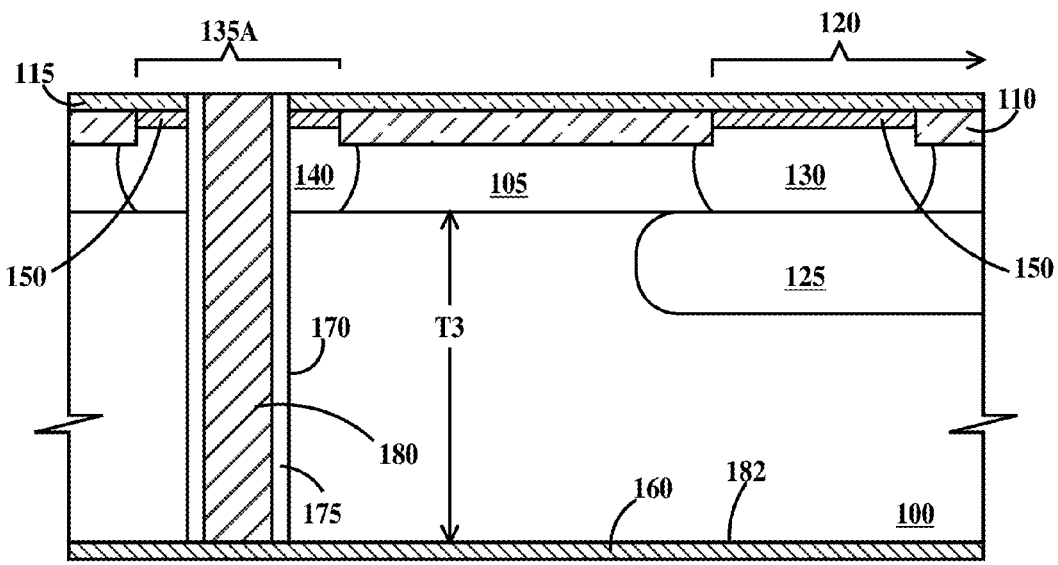

In FIG. 3C, the bottom surface of semiconductor substrate 100 has been ground down to expose through wafer via in the bottom surface 182 of semiconductor substrate 100 and conductive layer 160 form on the bottom surface 182 of semiconductor substrate 100 as the bottom surfaces of through wafer via 135A. After grinding, semiconductor substrate 100 has a thickness T3. In one example, T3 is between about 100 microns and about 175 microns.

Figure 3D:
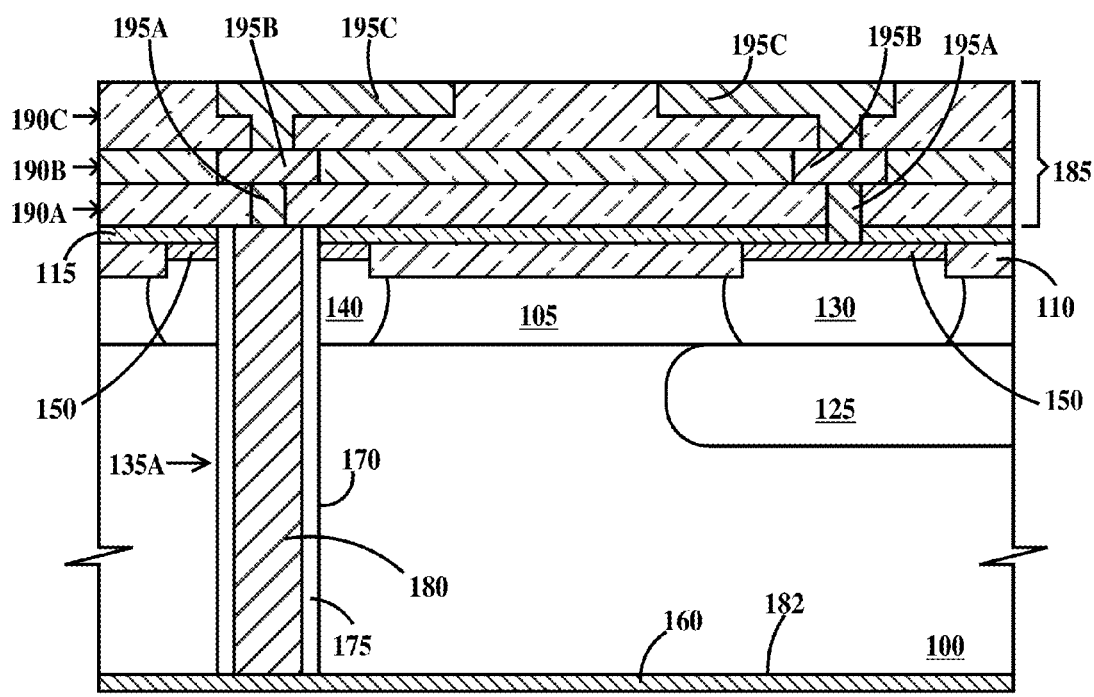

In FIG. 3D, interconnects 185 are formed over barrier layer 115. Interconnects 185 include first, second and third inter-level dielectric layers 190A, 190B and 190C having respective wires 195A, 195B and 195C formed therein. While only three levels are illustrated in FIG. 3D, there may be as few as one level or there may be more than three levels. If a depletion layer (see FIG. 1A) is formed that contacts polysilicon layer 175, because of the much greater doping level (e.g., at least about 1000 times greater) of polysilicon layer 175 than the doping level of semiconductor substrate 100, the depletion layer will not extend through polysilicon layer 175 to conductive core 180 thereby reducing the leakage current. In FIG. 3D, there is no other layer intervening between polysilicon layer 175 and electrical conductor 180. In FIG. 3D, there is no other layer intervening between polysilicon layer 175 and semiconductor substrate 100.

Figure 4A:
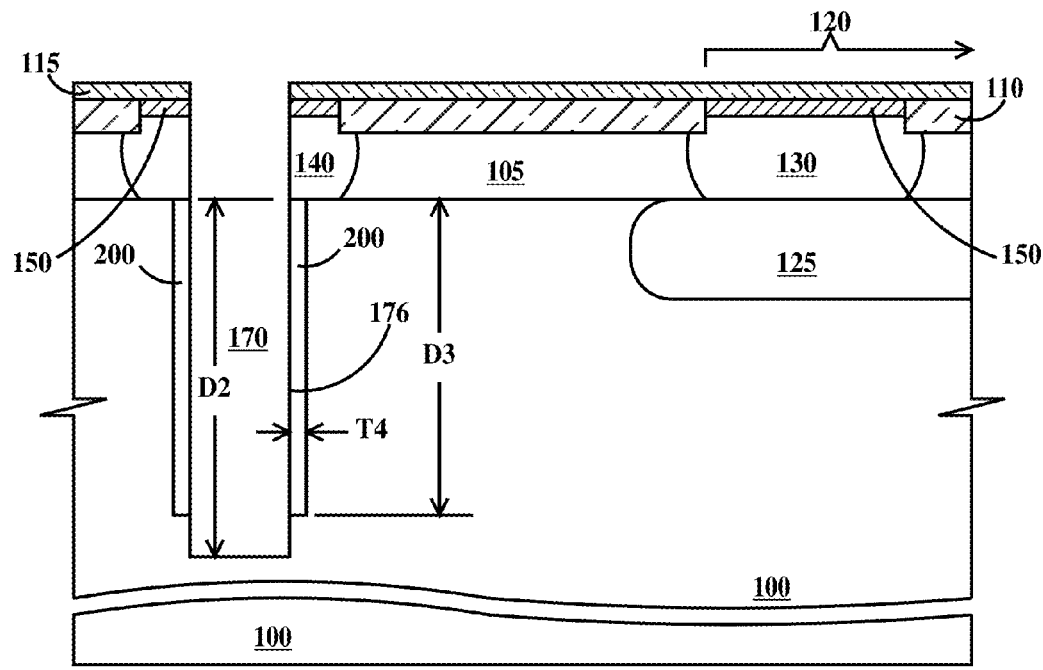
FIGS. 4A through 4D illustrate fabrication of a through wafer via according to another embodiment of the present invention.

FIGS. 4A through 4D illustrate fabrication of a through wafer via according to another embodiment of the present invention. FIG. 4A, continues from FIG. 2B. In FIG. 4A a P-type implanted doped layer 200 is formed in semiconductor substrate 100 adjacent to and abutting sidewalls 176 of trench. Trench 170 extends distance D2 into semiconductor substrate 100. Implanted doped layer 200 extends a distance D3 into semiconductor substrate 100 where D3 is less than D2. In one example, implanted doped layer 200 is formed by ion implantation of a P-type dopant species (e.g., boron containing species) into the sidewalls of trench 17 as illustrated in FIGS. 5 and 5A-5D and described infra. In one example, prior to forming implanted doped layer 200, an amorphization of the sidewalls of trench is performed. In one example, the amorphization is performed by ion implantation as illustrated in FIGS. 6 and 6A through 6D and described infra. In one example, the P-type doping level of implanted doped layer 200 is greater than the P-type doping level of semiconductor substrate 100. Doped layer has a thickness T4. In one example, T4 is between about 0.05 microns and about 0.5 microns. In one example, the P-type doping level of implanted doped layer 200 is between about $1\times10^{18}$ atoms/cm3 and about $1\times10^{20}$ atoms/cm3. In one example, the resistivity of liner 176 is between about 0.01 ohm-cm and about 0.04 ohm-cm. Since implanted doped layer 200 is formed by ion implantation, the implanted species must be activated. Because, the implanted doped layer is formed after metal silicide layers 150 have been formed, the temperature of semiconductor substrate 100 should not exceed about 600° C. during anneal, so normal rapid thermal anneals (RTAs), which normally exceed 600° C., can not be used to activate the implanted dopant atoms. Instead, a low temperature anneal in an inert atmosphere at a temperature of about 600° C. is used. The effectiveness of the low-temperature anneal is enhanced by the amorphization step which allows solid-phase re-crystallization at temperatures of about 600° C. or less.

Figure 4B:
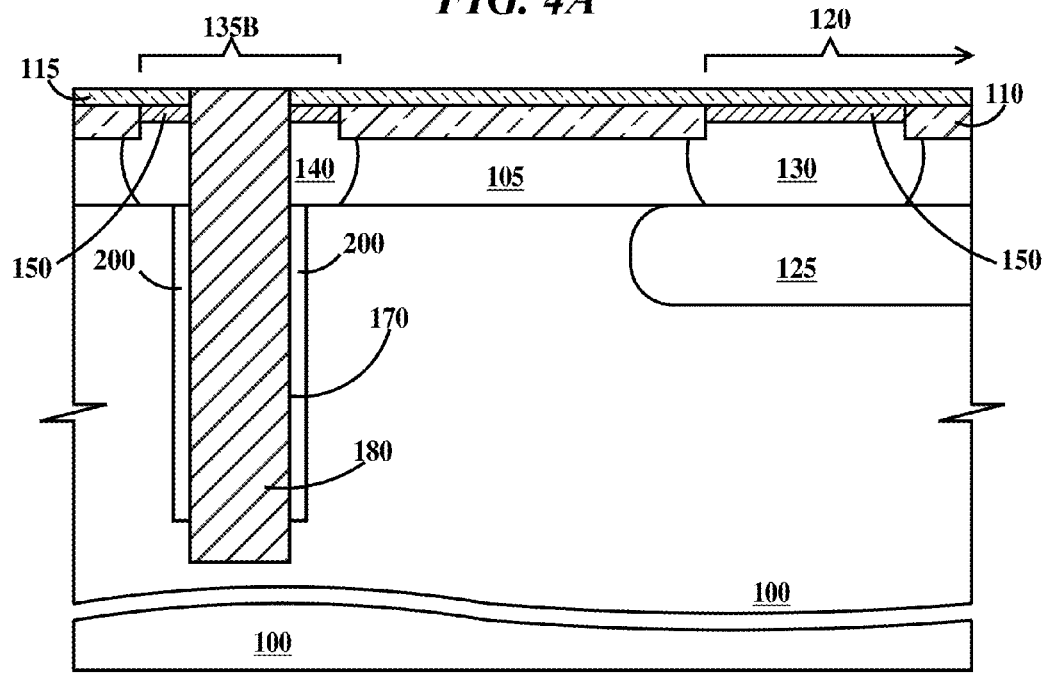

In FIG. 4B, the trench 170 is filled with electrical conductor 180 to form a through wafer via 135B. Again, in one example, electrical conductor 180 is a metal. Again, in one example, electrical conductor 180 is tungsten. Again, in one example, conductor 180 is form by deposition of a conductive layer that fills the remaining space in trench 170 followed by a chemical-mechanical-polish to coplanarize a top surface of conductor 180 and a top surface of barrier layer 115.

Figure 4C:
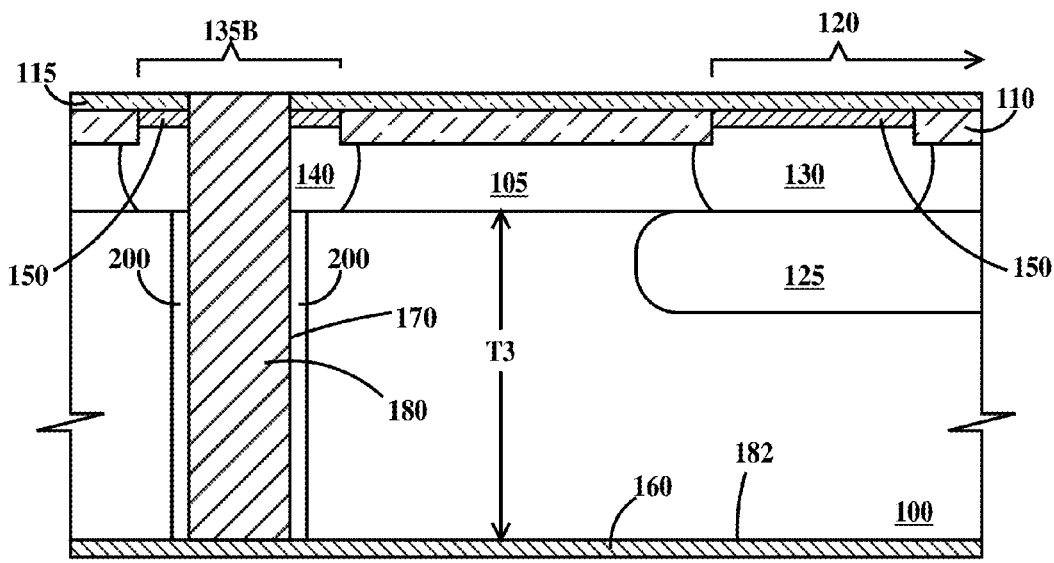
Figure 4D:
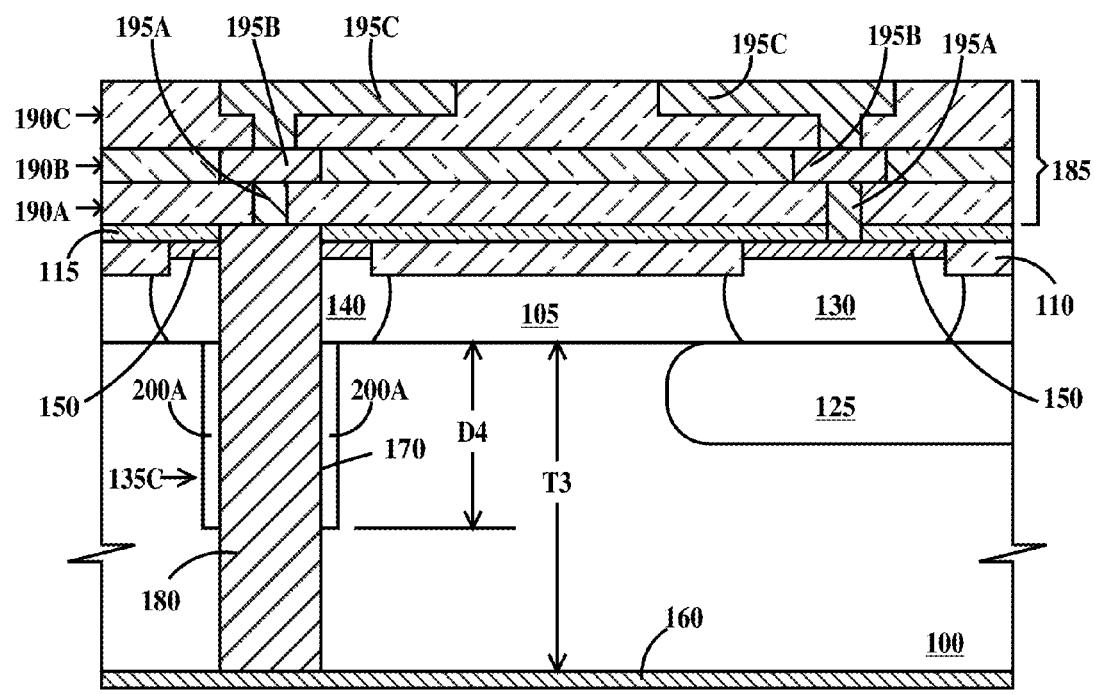

In FIG. 4C, the bottom surface of semiconductor substrate 100 has been ground down to expose through wafer via 135B in the bottom surface 182 of semiconductor substrate 100. After grinding, semiconductor substrate 100 has a thickness T3. In FIG. 4C, there is no other layer intervening between implanted doped layer 200 and electrical conductor 180. If a depletion layer (see FIG. 1A) is formed that contacts doped layer 200, because of the much greater doping level (e.g., at least about 1000 times greater) of implanted doped layer 200 than the doping level of semiconductor substrate 100, the depletion layer will not extend through implanted doped layer 200 to conductive core 180 thereby reducing the leakage current. In FIG. 4C, there is no other layer intervening between implanted doped layer 200 and semiconductor substrate 100. While implanted doped layer 200 extends from the top surface of semiconductor substrate 100 to bottom surface 182 of semiconductor substrate 100, in an alternative embodiment (see FIG. 4D), implanted doped layer 200 does not extend to the bottom surface of semiconductor substrate 100 as illustrated in FIG. 4D. This may also be the case for doped polysilicon layer 180 of FIGS. 3A, 3B, 3C and 3D, where doped polysilicon layer 175 would not extend to the bottom surface of semiconductor substrate 100.

In FIG. 4D, a through wafer via 135C differs from through wafer via 135B of FIG. 4C only in the fact that an implanted doped layer 200A does not extend to bottom 182 of semiconductor substrate 100 as implanted doped layer 200 of FIG. 4C does, but only extends a distance D4 into semiconductor substrate 100. In one example, D4 is about 50% of T3. In one example, D4 is selected such that, at a designed bias voltage between subcollector 125 and through wafer via 180, any depletion layer formed will not extend deep enough into semiconductor substrate 100 to contact those portions of conductive layer 180 not surrounded by implanted doped layer 200A.

In FIG. 4D, interconnects 185 are formed over barrier layer 115. Interconnects 185 include first, second and third inter-level dielectric layers 190A, 190B and 190C having respective wires 195A, 195B and 195C formed therein. While only three levels are illustrated in FIG. 4D, there may as few as one level or there may be more than three levels. If a depletion layer (see FIG. 1A) is formed that contacts doped layer 175, because of the much greater doping level (e.g., at least about 10 times greater) of implanted doped layer 200A than the doping level of semiconductor substrate 100, the depletion layer will not extend through implanted doped layer 200A to conductive core 180 thereby reducing the leakage current. In FIG. 4D, there is no other layer intervening between implanted doped layer 200A and electrical conductor 180. In FIG. 4D, there is no other layer intervening between implanted doped layer 200A and semiconductor substrate 100. It should be understood that interconnects 185 may be formed over the structure illustrated in FIG. 4C incorporating through wafer via 135B.

FIGS. 5, 5A, 5B, 5C and 5D, illustrate the ion-implantation steps of FIG. 4A. FIG. 5 is a top view of trench 170. Trench 170 has a first sidewall 170A and a second and opposite sidewall 170B; and a third sidewall 170C and a fourth and opposite sidewall 170D. The width of trench 170 between sidewalls 170C and 170D at the top of the trench is W1 and the width of trench 170 between sidewalls 170A and 170B at the top of the trench is W3. As illustrated in FIG. 5, W3 is greater than W1. Alternatively, W1 and W3 may be equal. In one example, W3 is between about 3 microns and about 40 microns. The ion implantation used to form implanted doped layer 200 (see FIG. 4B) comprises four angled ion implantations with semiconductor substrate 100 rotated 90° between ion implants as illustrated in FIGS. 5A, 5B, 5C and 5D. The first and third ion implantations of FIGS. 5A and 5C are performed at angle "A" relative a line perpendicular to the top surface of semiconductor substrate 100, where $A=\tan^{-1}(W1/D3)$. D3 is the depth of the doped region (see FIG. 4B). With W1=5 microns and D3=100 microns, A≈2.9°. The second and fourth ion implantations of FIGS. 5B and 5D are performed at angle "B" relative a line perpendicular to the top surface of semiconductor substrate 100, where $B=\tan^{-1}(W3/D3)$. With W1=10 microns and D3=100 microns, B≈1.5°. The ion implantation species "P" is a P-dopant species, for example, a species containing Boron. In one example, a boron ion implantation at a dose of about $1\times10^{18}$ atm/cm$^2$ and about 100 KeV is used.

Figure 6:
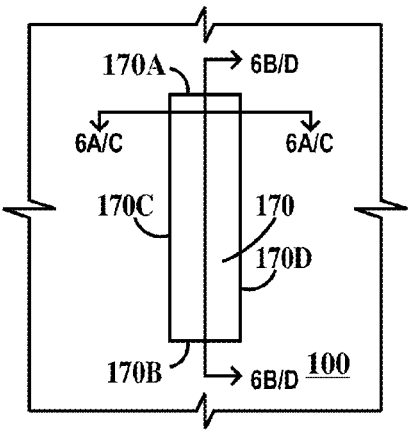
FIGS. 6, 6A, 6B, 6C and 6D, illustrate optional ion-implantation steps of FIG. 4A.
Figure 6A:
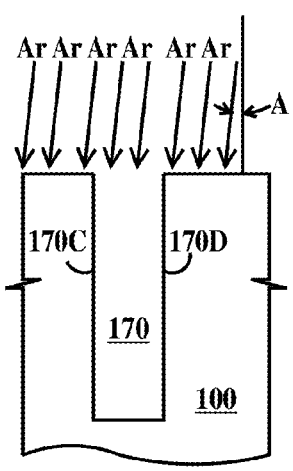
Figure 6B:
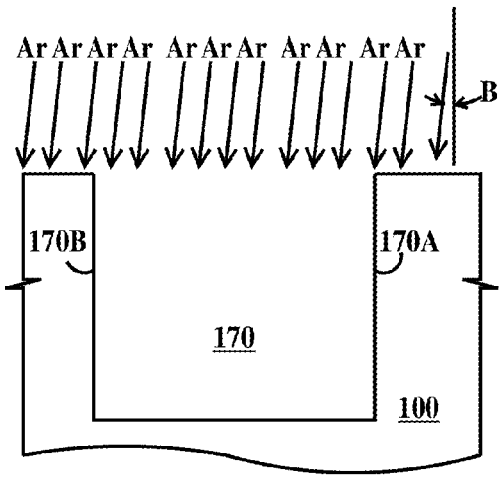
Figure 6C:
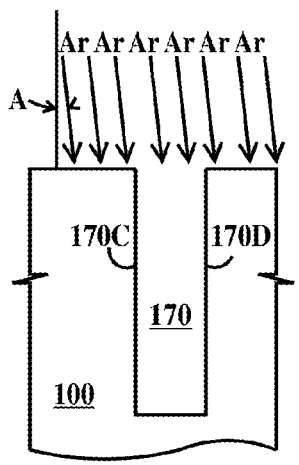
Figure 6D:
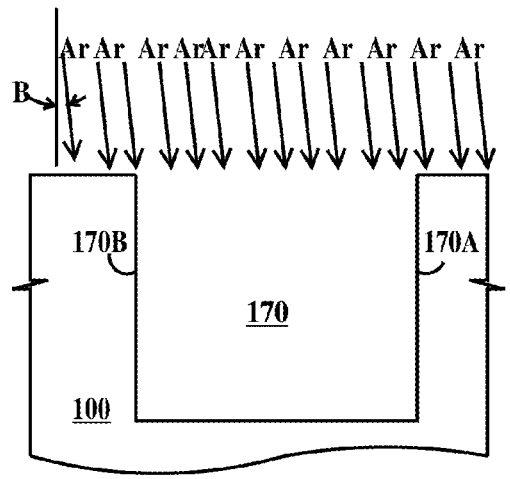

FIGS. 6, 6A, 6B, 6C and 6D, illustrate optional ion-implantation steps of FIG. 4A through 4D. The amorphization ion implantation comprises four angled ion implantations with semiconductor substrate 100 rotated 90° between ion implants as illustrated in FIGS. 6A, 6B, 6C and 6D. The first and third ion implantations of FIGS. 6A and 6C are performed at the angle "A" as described supra. The second and fourth ion implantations of FIGS. 5B and 5D are performed at angle "B" as described supra. In one example, the ion implantation species "Ar" is Argon. Other inert gases such as Neon, Krypton, and Xeon may be used. In one example, an argon ion implantation at a dose of about $1 \times 10^{15}$ atm/cm$^2$ and about 100 KeV is used. The amorphization ion implantation generates a polysilicon layer in said semiconductor substrate abutting all sidewalls of trench 170 which is later re-crystallized after implanting the dopant species by annealing at about 600° C. The re-crystallization incorporates the dopant atoms in the substrate lattice, thus "activating" the dopant atoms.

Figure 7:
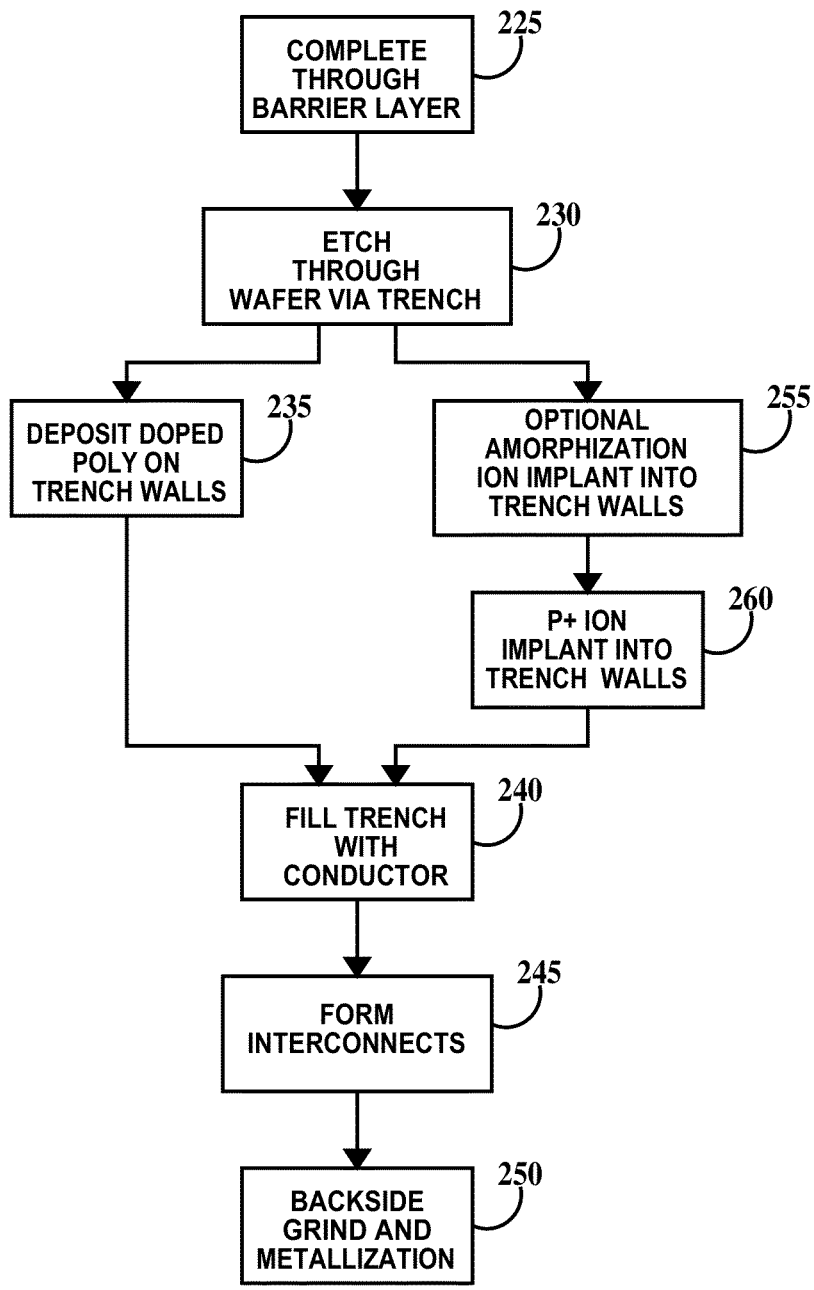
FIG. 7 is a flowchart of the methods of fabricating through wafer vias according to embodiments of the present invention.

FIG. 7 is a flowchart of the methods of fabricating through wafer vias according to embodiments of the present invention. In step 225, fabrication of integrated circuit chips through formation of a barrier layer is completed. This means devices such as bipolar and field effect transistors (FETs) have been completed and metal silicide contacts to the devices have been formed. In step 230, through wafer via trenches are etched into the wafer (semiconductor substrate). In an embodiment, the method proceeds to step 235. In step 235, P-type doped polysilicon is deposited on at least the sidewalls of the trenches. Next, the method proceeds to step 240. In step 240, the trenches are filled with an electrical conductor. In step 245, interconnects are formed that interconnect the various devices into electrical circuits. In step 250, the wafer in thinned by backside grinding. After backside grinding, a backside metallization is performed and then the wafer is singulated (e.g., diced) into individual integrated circuit chips.

In another embodiment, after step 230, the method proceeds to step 255. In step 255, an optional amorphization ion implant into the trench walls is performed and in step 260, a P-doped ion implantation into the trench sidewalls is performed followed by an anneal in an inert atmosphere at a temperature of about 600° C. or less. Next, the method proceeds to step 240.

Figure 8:
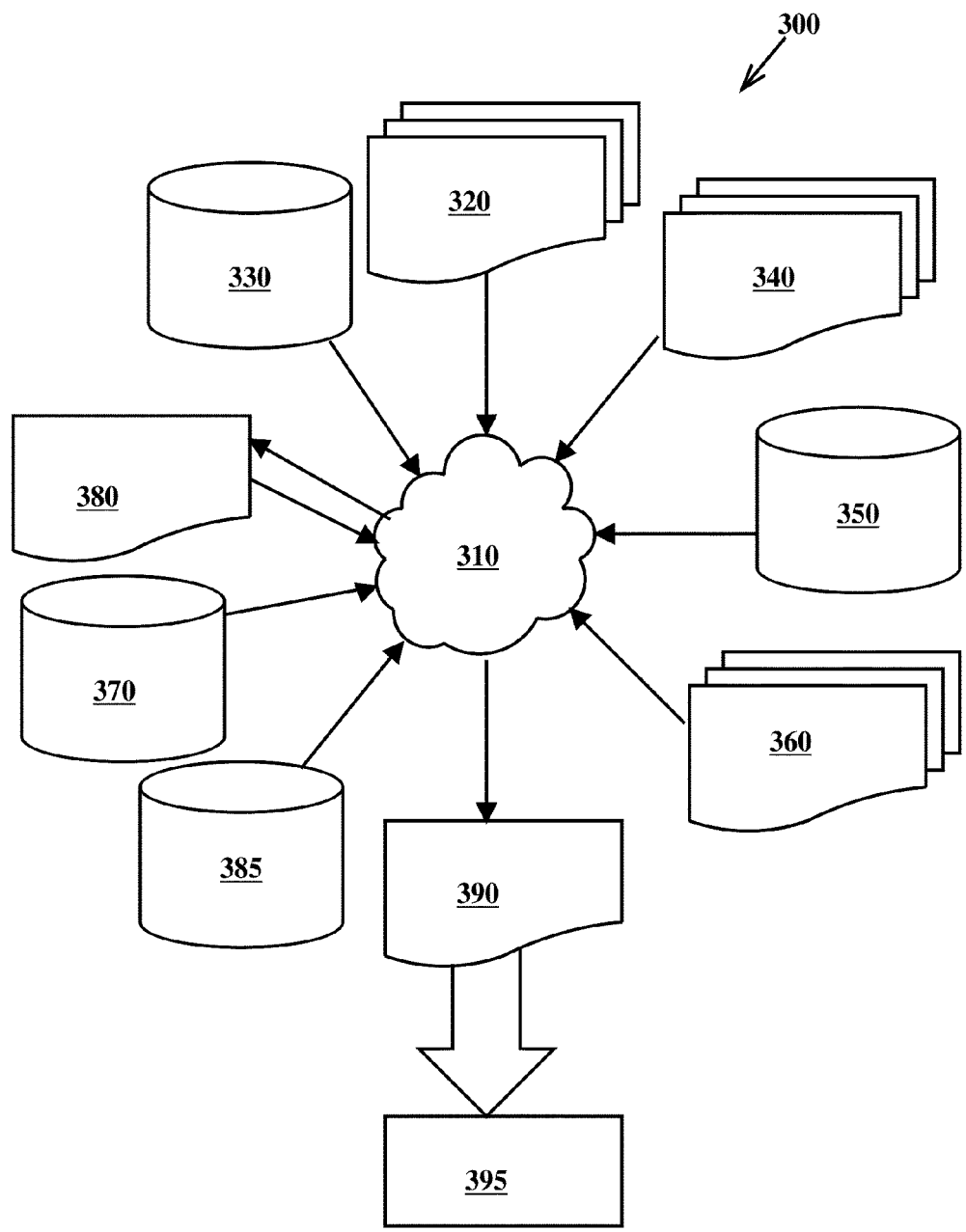
FIG. 8 is a flow diagram of a design process used in semiconductor design, manufacture, and/or test of through wafer vias according to embodiments of the present invention.

FIG. 8 is a flow diagram of a design process used in semiconductor design, manufacture, and/or test of through wafer vias according to embodiments of the present invention. Design flow 300 includes processes and mechanisms for processing design structures or devices to generate logically or otherwise functionally equivalent representations of the design structures and/or devices described above and shown in FIGS. 3D and 4D. The design structures processed and/or generated by design flow 300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Design flow 300 may vary depending on the type of representation being designed. For example, a design flow 300 for building an application specific IC (ASIC) may differ from a design flow 300 for designing a standard component or from a design flow 300 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 320 that is preferably processed by a design process 310. In one embodiment, an input design structure 320 comprises design data used in a design process and comprising information describing an embodiment of the invention with respect to through wafer vias as shown in FIGS. 3D and 4D. The design data in the form of schematics or HDL, a hardware description language (e.g., Verilog, VHDL, C, etc.) may be embodied on one or more machine-readable media. For example, input design structure 320 may be a text file, numerical data or a graphical representation of an embodiment of the invention as shown in FIGS. 3D and 4D. In put design structure 320 may be a logical simulation design structure generated and processed by design process 310 to produce a logically equivalent functional representation of a hardware device. Input design structure 320 may also or alternatively comprise data and/or program instructions that when processed by design process 310, generate a functional representation of the physical structure of a hardware device. Whether representing functional and/or structural design features, input design structure 320 may be generated using electronic computer-aided design (ECAD) such as implemented by a core developer/designer. When encoded on a machine-readable data transmission, gate array, or storage medium, input design structure 320 may be accessed and processed by one or more hardware and/or software modules within design process 310 to simulate or otherwise functionally represent an electronic component, circuit, electronic or logic module, apparatus, device, or system such as those shown in FIGS. 3D and 4D. As such, input design structure 320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware description language (HDL) design entities or other data structures conforming to and/or compatible with lower-level HDL design languages such as Verilog and VerilogHDL (VHDL), and/or higher-level design languages such as C or C++.

Design process 310 preferably employs and incorporates hardware and/or software modules for synthesizing, translating, or otherwise processing a design/simulation functional equivalent of the components, circuits, devices, or logic structures shown in FIGS. 3D and 4D to generate a netlist 380 which may describe design structures such as input design structure 320. Netlist 380 may comprise, for example, compiled or otherwise processed data structures representing a list of wires, discrete components, logic gates, control circuits, I/O devices, models, etc. that describes the connections to other elements and circuits in an integrated circuit design. Netlist 380 may be synthesized using an iterative process in which netlist 380 is re-synthesized one or more times depending on design specifications and parameters for the device. As with other design structure types described herein, netlist 380 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 310 may include hardware and software modules for processing a variety of data structure types including netlist 380. Such data structure types may reside, for example, within library elements 330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 340, characterization data 350, verification data 360, design rules 370, and test data files 385 which may include input test patterns, output test results, and other testing information. Design process 310 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 310 without deviating from the scope and spirit of the invention. Design process 310 may also include modules for performing standard circuit design processes such as timing analysis, verification, design rule checking, place and route operations, etc.

Design process 310 employs and incorporates logic and physical design tools such as HDL compilers and simulation model build tools to process design structure 320 together with some or all of the depicted supporting data structures along with any additional mechanical design or data (if applicable), to generate a second design structure 390 comprising second design data embodied on a storage medium in a data format used for the exchange of layout data of integrated circuits and/or symbolic data format (e.g. information stored in a GDSII (Graphic Data System II)II (GDS2), GL1 (Graphic Language 1), Organization for the Advancement of Structured Information Standards (OASIS) format (formerly known as (Standard Generalized Mark-up Language) SGML Open), map files, or any other suitable format for storing such design structures). In one embodiment, the second design data resides on a storage medium or programmable gate array in a data format used for the exchange of data of mechanical devices and structures (e.g. information stored in an Initial Graphics Exchange Specification (IGES), Drawing Exchange Format (DXF), Parasolid XT, JT, (Digital Raster Graphics) DRG, or any other suitable format for storing or rendering such mechanical design structures). Output design structure 390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 3D and 4D. In one embodiment, output design structure 390 may comprise a compiled, executable HDL simulation model that functionally simulates the devices shown in FIGS. 3D and 4D.

Output design structure 390 may also employ a data format used for the exchange of layout data of integrated circuits and/or symbolic data format (e.g. information stored in a GDSII (GDS2), GL1, OASIS, map files, or any other suitable format for storing such design data structures). Output design structure 390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 3D and 4D. In one example, output design structure 390 is in the form of a netlist. Output design structure 390 may then proceed to an output stage 395 where, for example, output design structure 390: proceeds to tape-out, is released to manufacturing, is released to a mask house, is sent to another design house, is sent back to the customer, etc.

Thus, the embodiments of the present invention provide un-insulated through wafer vias, and methods of fabricating passivated (but not insulated buy a dielectric layer) through wafer vias, that may be placed in closer proximity to device structures in very low doped semiconductor substrates then hereto before has not been possible.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
   forming a through wafer via in a semiconductor substrate, said through wafer via comprising an electrical conductor extending from a top of said semiconductor substrate to a bottom surface of said semiconductor substrate; and
   forming a doped layer abutting all sidewalls of said electrical conductor, said doped layer of a same dopant type as said semiconductor substrate, the concentration of dopant in said doped layer greater than the concentration of dopant in said semiconductor substrate, said doped layer intervening between said electrical conductor and said semiconductor substrate.

2. The method of claim 1, further including:
   prior to forming said through wafer via, forming a doped region of a device in said semiconductor substrate, said doped region doped an opposite doping type to the doping type of said semiconductor substrate and said doped layer.

3. The method of claim 2, wherein when a voltage is applied between said doped region of said device and said through wafer via, a depletion region extending from said doped region in said semiconductor substrate is prevented from physically contacting said through wafer via by said doped layer.

4. The method of claim 1, wherein:
   said semiconductor substrate is single crystal silicon and is doped p-type and has a resistivity of about 1,000 ohm-cm or higher.

5. The method of claim 1, wherein said electrical conductor is a metal.

6. The method of claim 1, including:
   thinning said semiconductor substrate by removing a layer of said bottom of said semiconductor substrate to expose said electrical conductor and said doped layer in a bottom surface of the thinned semiconductor substrate.

7. The method of claim 6, wherein said doped layer extends from said top surface of said thinned semiconductor substrate into said thinned semiconductor substrate a distance that is equal to or greater than 50% of the thickness of said thinned semiconductor substrate.

8. The method of claim 1, including:
   forming a trench in said semiconductor substrate, said trench extending from a top said semiconductor substrate into said semiconductor substrate toward a bottom of said semiconductor substrate;
   forming a doped polysilicon layer on all sidewalls of said trench to form said doped layer; and
   filling remaining space in said trench with said electrical conductor.

9. The method of claim 1, including:
   forming a trench in said semiconductor substrate, said trench extending from a top said semiconductor substrate into said semiconductor substrate toward a bottom of said semiconductor substrate;

ion implanting a dopant species into sidewalls of said trench to form an ion implanted layer in said semiconductor substrate, said implanted layer abutting all sidewalls of said trench;

activating said dopant species to form said doped layer; and filling remaining space in said trench with said electrical conductor.

10. The method of claim 9, wherein said activating includes heating said semiconductor substrate to a temperature of no greater than about 600° C.

11. The method of claim 9, including:

prior to said ion implanting said dopant species into said sidewalls of said trench, performing an amorphization ion implantation into said sidewalls of said trench, said amorphization ion implantation generating a polysilicon layer in said semiconductor substrate abutting all sidewalls of said trench.

12. A structure, comprising:

a through wafer via in a semiconductor substrate, said through wafer via comprising an electrical conductor extending from a top of said semiconductor substrate to a bottom surface of said semiconductor substrate; and a doped layer abutting all sidewalls of said electrical conductor, said doped layer of a same dopant type as said semiconductor substrate, the concentration of dopant in said doped layer greater than the concentration of dopant in said semiconductor substrate; and, said doped layer intervening between said electrical conductor and said semiconductor substrate.

13. The structure of claim 12, further including:

a doped region of a device in said semiconductor substrate, said doped region doped an opposite doping type to the doping type of said semiconductor substrate and said doped layer.

14. The structure of claim 13, wherein when a voltage is applied between said doped region of said device and said through wafer via, a depletion region extending from said doped region in said semiconductor substrate is prevented from physically contacting said through wafer via by said doped layer.

15. The method of claim 12, wherein:

said semiconductor substrate is single crystal silicon and is doped p-type and has a resistivity of about 1,000 ohm-cm or higher.

16. The structure of claim 12, wherein said electrical conductor is a metal.

17. The structure of claim 12, including:

said electrical conductor and said doped layer extend to and are coplanar with a bottom surface of said semiconductor substrate.

18. The structure of claim 12, wherein said doped layer extends from said top surface of said thinned semiconductor substrate into said thinned semiconductor substrate a distance that is equal to or greater than 50% of the thickness of said thinned semiconductor substrate.

19. The structure of claim 12, wherein said doped layer comprises a doped polysilicon layer.

20. The structure of claim 12, wherein said doped layer comprises an ion implanted layer in said semiconductor substrate.

21. A design structure comprising design data tangibly embodied in a machine-readable medium, the design data being used for designing, manufacturing, or testing an integrated circuit, the design data comprising information describing a passivated through wafer via structure, the passivated through wafer via structure comprising:

a through wafer via in a semiconductor substrate, said through wafer via comprising an electrical conductor extending from a top of said semiconductor substrate to a bottom surface of said semiconductor substrate; and a doped layer abutting all sidewalls of said electrical conductor, said doped layer of a same dopant type as said semiconductor substrate, the concentration of dopant in said doped layer greater than the concentration of dopant in said semiconductor substrate; and, said doped layer intervening between said electrical conductor and said semiconductor substrate.

22. The design structure of claim 21, including:

a doped region of a device in said semiconductor substrate, said doped region doped an opposite doping type to the doping type of said semiconductor substrate and said doped layer.

23. The design structure of claim 21, wherein the design structure comprises a netlist.

24. The design structure of claim 21, wherein the design structure resides on storage medium as a data format used for the exchange of layout data of integrated circuits.

25. The design structure of claim 21, wherein the design structure resides in a programmable gate array.

* * * * *